United States Patent
Vane

(10) Patent No.: US 6,452,315 B1
(45) Date of Patent: Sep. 17, 2002

(54) COMPACT RF PLASMA DEVICE FOR CLEANING ELECTRON MICROSCOPES AND VACUUM CHAMBERS

(76) Inventor: Ronald A. Vane, 3124 Wessex Way, Redwood City, CA (US) 94061

( * ) Notice: Subject to any disclaimer, the term of this patent is extended or adjusted under 35 U.S.C. 154(b) by 0 days.

(21) Appl. No.: 09/499,909

(22) Filed: Feb. 8, 2000

(51) Int. Cl.[7] .................................................. H01J 17/26
(52) U.S. Cl. ........................... 313/231.31; 313/231.61; 313/361.1; 315/111.21; 315/111.71
(58) Field of Search .................... 313/362.1, 231.31, 313/231.61; 315/111.21, 111.71

(56) References Cited

U.S. PATENT DOCUMENTS

| | | | |
|---|---|---|---|
| 3,769,537 A | * 10/1973 | Hofmann | 313/157 |
| 4,665,315 A | 5/1987 | Bacchhetti et al. | |
| 4,810,935 A | * 3/1989 | Boswell | 118/723 IR |
| 4,859,908 A | * 8/1989 | Yoshida et al. | 118/723 R |
| 4,977,352 A | 12/1990 | Williamson | |
| 5,007,983 A | 4/1991 | Lerner | |
| 5,241,243 A | 8/1993 | Ciri | |
| 5,312,519 A | 5/1994 | Sakai et al. | |
| 5,510,624 A | 4/1996 | Zaluzec | |
| 5,976,992 A | 11/1999 | Ui | |

OTHER PUBLICATIONS

U.S. patent application Ser. No. 09/552,449, Vane, filed Apr. 18, 2000.
U.S. patent application Ser. No. 09/228,318, Vane, filed Apr. 5, 1999.
*Oxidative Cleaning in SEMs*, Ronald Vane, XEI Scientific, Redwood City, CA 1999.

* cited by examiner

Primary Examiner—Sandra O'Shea
Assistant Examiner—Guiyoung Lee

(57) ABSTRACT

An improved apparatus is provided for in-situ cleaning of electron microscopes and other vacuum chambers. A special RF plasma electrode is housed in a compact cylinder constructed of standard vacuum components and a electrical feedthrough. The device allows oxygen radicals to be generated from air by a low powered RF plasma. The oxygen radical flow by convection into the electron microscope or vacuum chamber to be cleaned and react with hydrocarbons to form CO and H2O vapor which is pumped away.

2 Claims, 2 Drawing Sheets

COMPACT RF PLASMA DEVICE

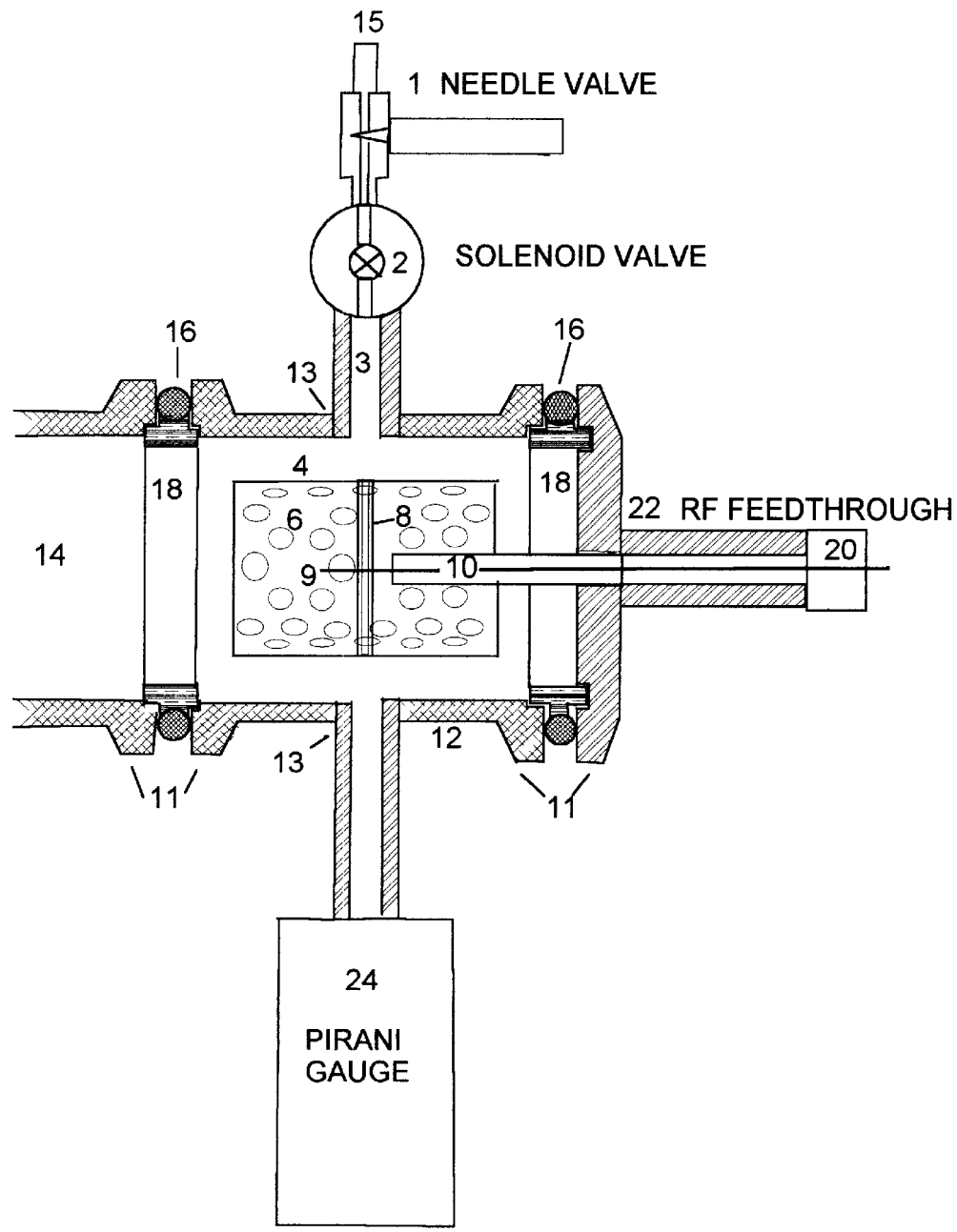
FIG. 1 COMPACT RF PLASMA DEVICE

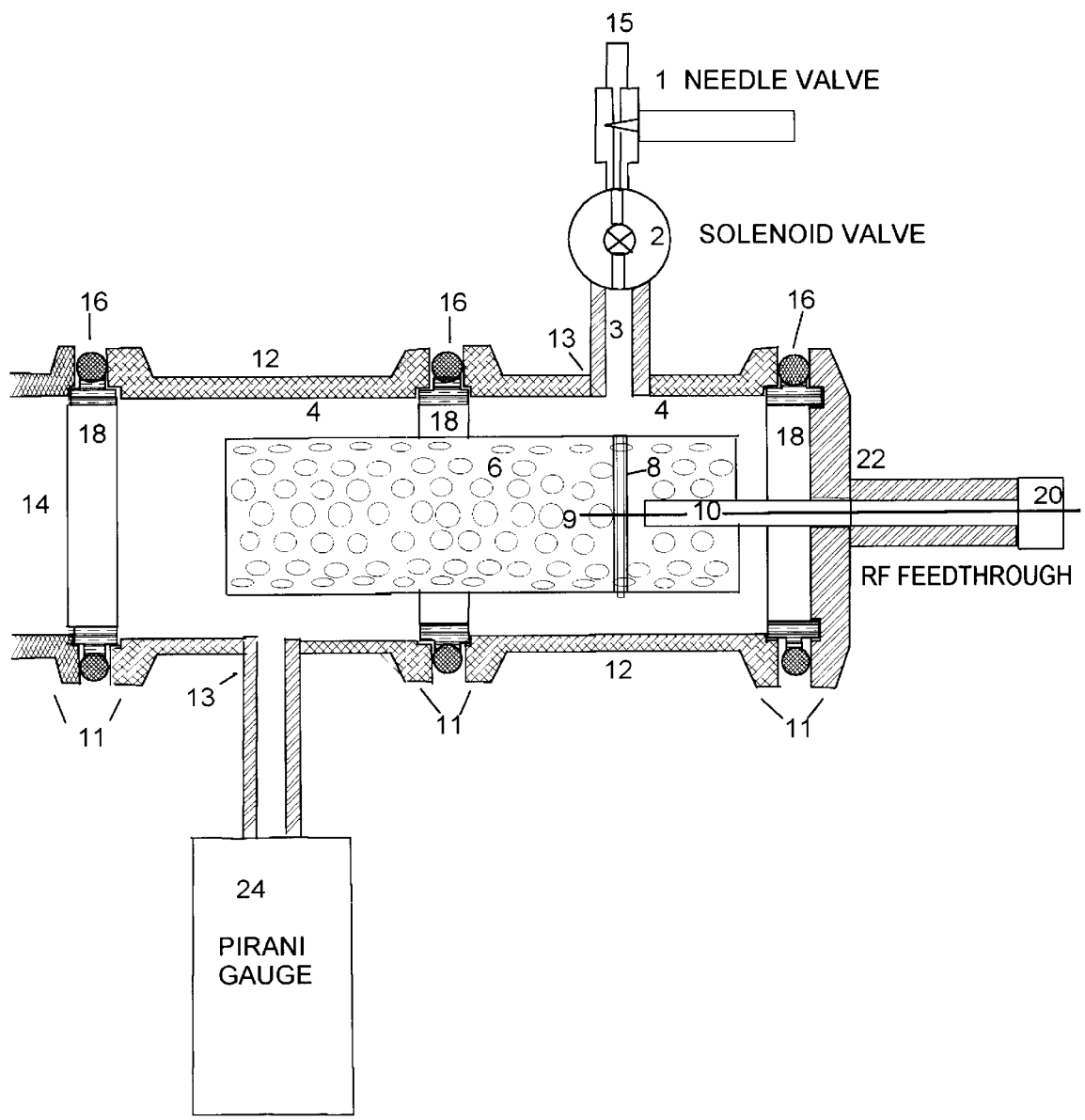
FIG. 2 EXTENDED RF PLASMA DEVICE

COMPACT RF PLASMA DEVICE FOR CLEANING ELECTRON MICROSCOPES AND VACUUM CHAMBERS

RELATED PATENT APPLICATIONS: 09/054,749 filed Apr. 3, 1998 now abandoned. U.S. Pat. No. 6,105,589 issued 8/22/200, filed Jan. 11, 1999: "Oxidative Cleaning Method and Apparatus for Electron Microscopes Using an Air Plasma as an Oxygen Radical Source" by Ronald Vane and a C.I.P patent application of the above 09/552,449 "Low RF Power Electrode for Plasma Generation of Oxygen Radicals from Air". The present invention discloses a specific apparatus design for use with the above method and with the above electrode.

BACKGROUND OF THE INVENTION

1. Field of Invention

The present invention relates to a low-vacuum plasma device for cleaning vacuum chambers and analytical instruments such as Scanning Electron Microscopes (SEM), Scanning Electron Microprobes, Transmission Electron Microscopes (TEM) and other charge particle beam instruments that are subject to contamination problems from hydrocarbons. In particular it is a novel RF plasma apparatus for generating active oxygen radicals from air that can be used for cleaning vacuum chambers such as found in electron microscopes and for other purposes. The oxygen radicals are used to oxidize the hydrocarbons and convert them to easily pumped gases. The apparatus can be added many types of vacuum systems without major modifications and can be used with other gas mixtures to generate a variety of active species. The apparatus is designed to be made from standard vacuum components and electrical feedthroughs.

2. Description Prior Art

The invention described in patent application Ser. No. (09/228,318) a disclosed a general method and apparatus for cleaning an electron microscope using air passed through a low powered RF plasma glow discharge to produce oxygen radicals. Divisional application (09/552,449) of the 09/228,318 application disclosed a cylindrical electrode with multiple apertures that works for generating oxygen radicals from air that operates at low RF power. A number of arrangements can be used to mount this electrode assembly in the vacuum chamber of the SEM that would allow the RF power to be supplied to this cylindrical electrode assembly and to have the reactive gas pass through the glow discharge plasma region. The plasma cleaning action of the cylindrical electrode with apertures of the previous invention was found to be almost independent of how it was mounted in the chamber and how it was enclosed.

It has been well documented that low temperature (<50° C.) plasmas of various ionized gases can be used to reactively etch/ash organic materials found on the surface of materials. As "glow-discharge cleaning" it has been used by the high-energy physics community to condition the interiors of large vacuum vessels. Named "plasma etch" or "plasma ashing", it has been used in the industrial community to clean and etch semiconductor wafers and other bulk materials for many years. In the microscopy community RF or DC plasma, dry-ashing devices are sold by several vendors to clean electron microscope specimens prior to analysis. In this procedure, typically the material is placed in an RF cavity or a DC cavity with a flowing reactive gas. The nature of the gas selected is chosen based upon the desired effect. Argon, nitrogen, air, oxygen or other gas mixtures are commonly used, and gases ($BCl_3$, $CF_4$) may be used to tailor the reaction.

Most of the current literature and recent patents on glow-discharge cleaning and plasma etch is concerned with the use of these processes in semiconductor production. For these processes plasma uniformity, anisotropic etching, and other highly controlled properties are important. The geometry of these systems is very carefully designed for uniform results. A variety of gases can be used for etching and cleaning. Gases such as Hydrogen, Argon, Nitrogen, Oxygen, $CF_4$ and gas mixtures such as air and argon/oxygen have successfully been used for glow-discharge cleaning and plasma etching. Depending on the process the importance of ion sputtering and reactive ion etching varies, but in most of processes the neutral free radicals are the most important reactive species in the plasma. The free radicals, because they are neutral, are able to leave the electric fields of the excitation region and travel throughout the chamber by convection.

For the cleaning and removal of hydrocarbons the reaction with oxygen radicals to produce $CO$, $CO_2$ and $H_2O$ is the most important. These reaction products are quickly removed as gases from the vacuum system. These reactions are the dominant reactions in glow discharge cleaning methods using oxygen as a reactant gas. The glow discharge is used to produce oxygen ions that are then transformed into oxygen radicals by subsequent reactions. The oxygen ions are not needed as the reactive species for hydrocarbons. In the absence of nitrogen ions or other reactive species that destroy O radicals, O radicals are long lived and have the ability to do isotropic cleaning on all surfaces in the chamber. To prevent the formation of Nitrogen ions or other active species that destroy O radical a low temperature plasma is needed. The Ionization potential; of nitrogen is that of oxygen. In low temperature plasmas in low vacuum air the formation of oxygen ions is favored and leads to the formation of oxygen radicals in useful quantities.

Conventional RF or DC plasma cavities for the production of plasmas are usually of four different types: parallel plates for DC and RF capacitivly coupled plasmas, RF inductive coils, RF multiple electrodes, and hollow cathodes. At high vacuums magnets are often used to confine the free electrons to keep the plasma ignited. Parallel plates and inductive coils and their variations are the classical "textbook" designs and well understood. Designs with multiple electrodes that are of opposite RF potential have been devised for filling vacuum cavities with plasmas for etching and cleaning purposes. The hollow cathode design is efficient because it traps the electrons between the walls of the cathode and results in higher free electron densities. Because they are usually purely capacitive or inductive they require high voltages or power to ignite the plasma. Typical peak to peak RF voltages are above 400 V and power is above 100 W. This results in a relatively high energy or high temperature electrons in the plasma. Many of these sources are designed to create plasmas under difficult conditions of either high vacuum or atmospheric pressure where it is harder to ignite or sustain a plasma. At low vacuum between 0.1 Torr and 2 Torr gases become highly conductive and plasmas are easy to ignite and sustain. At these pressures almost any shape of electrode inside a grounded metal vacuum chamber will ignite and sustain a plasma with the application of sufficient RF power if the impedance of the RF circuit is properly matched between the source and the load.

To mount a plasma device on an electron microscope or other vacuum system the designer must consider how to fabricate the device economically. The manufacturing of custom vacuum parts is machine shop is very expensive.

Therefore it is useful to use standard vacuum parts for assembly of the system. ISO components (a flange system designed in accordance with ISO, International Standards Organization—standard 2861/1) are an economical, convenient and simplified means of constructing custom vacuum devices and systems. This flange system consists of two identical, symmetrical flanges, a centering ring that supports an elastomer "O" ring and a clamp that compresses the sealing ring between the two flanges. These ISO fittings have a variety of designations from their manufacturers as KF, QF, NW, etc. and are referred to in this specification as ISO KF. An alternate flange system with copper gaskets is suitable for ultra high vacuum applications. This system is known as CF or Conflat® (a registered trademark of Varian Associates). The CF system is not used on the chambers of electron microscopes but is common in other types of ultra high vacuum instruments. In both the ISO KF and CF flange system there are available RF coaxial feedthroughs and various sized adapters and fittings.

SUMMARY OF THE INVENTION

The present invention is directed to an apparatus for housing a cylindrical electrode and supplying RF power and reactive gas to a plasma around the electrode. The apparatus produces oxygen radicals with a reactive gas of air, with the RF power below 15 Watts, and with the vacuum between 0.2 Torr and 1 Torr. At these pressures and power levels sputtering is suppressed which minimizes electrode and chamber damage and sputter contamination. The apparatus is mounted on electron microscopes and other vacuum chambers for the purpose of making oxygen radicals from air for reactively removing hydrocarbons for the walls of the chamber. It is also useful as a device for generating low energy active species from a variety of gases at that uses a low power RF generator and is simple to construct from commercial parts.

Meeting the following mechanical and physical requirements is an object of the present invention:

1. Mountable with simple adapter flange on a port of most commercial electron microscopes.
2 No mechanical interference with other common microscope accessories and detectors.
3 Compact.
4 Simple to make out of commercial parts with standard sized flanges and having little custom fabrication.
5 Have a vacuum gauge and metered gas inlet into the plasma region.
6 Can operate at low RF power and in low vacuum The present invention covers the use of a small cylindrical chamber, a coaxial electrical feedthrough for RF power, the mounting of the cylindrical electrode with apertures to the feed through, the feeding of an reactive gas such as air into to side of the chamber and the mounting of a pirani gauge to the chamber for measuring the vacuum.

BRIEF DESCRIPTION OF THE FIGURES

The present invention together with the above and other objects and advantages may best be understood from the following detailed description of the preferred embodiments of the invention illustrated in the drawing, wherein:

FIG. 1 is a cross sectional view of a compact RF plasma device that is assembled from standard vacuum fittings.

FIG. 2 is cross sectional view of an extended RF plasma device the is twice the length that in FIG. 1 that utilizes a higher gas flow rate to make more active species from the gas.

REFERENCE NUMBERS IN DRAWINGS

1 Needle valve
2 Solenoid valve
3 Gas inlet
4 Plasma chamber
6 Cylindrical electrode with apertures
8 Electrode support cross bar
9 RF conductor (coaxial)
10 Ceramic insulator
11 ISO KF 40 flanges
12 Chamber body with F=KF 40 flanges
13 Threaded Holes
14 KF40 connector flange to main chamber
15 Gas feed port
16 O-ring
18 KF40 centering ring
20 Coaxial RF connector
22 RF feedthrough on KF40 flange
24 Pirani gauge

DETAILED DESCRIPTION OF THE PREFERRED EMBODIMENTS

In accordance with the invention a plasma generating apparatus has been developed that is compact and operates in low vacuum at low voltage and low power that generates active species from air or other gases for use in cleaning vacuum chambers or other reactive processes. The device has utility for cleaning electron microscopes and other high vacuum analytical instruments and high vacuum chambers. It also has utility as an active species source for a variety of other processes and process development where a small RF plasma source is desired The first preferred embodiment of the invention consists of following parts as shown in FIG. 1. The cylindrical body 12 of the device has ISO KF40 vacuum flanges 11 at both ends. A vacuum seal is made between the ISI KF flanges 11 by means of an elastomer O-ring 16 that is held in place by a centering ring 18.The ISO KF 40 flanges 11 are held together by standard ISO KF clamps which are not shown for clarity. The inside diameter of the body 12 is about 40 mm. The length of the body 12 is about 40 mm. Two ⅛ NPT threaded holes 13 enter the body from the sides. These holes are used for a gas inlet 3 and a pirani gauge 24 for measuring vacuum. On one end of the cylinder body 12 is mounded a coaxial feedthrough 22 on a mating ISO KF 40 flange with a conductor 9 extending coaxially into the middle of the chamber. On the outside end of the feedthrough a coaxial RF connector 20 allows RF power to be fed to the conductor 9. The base of the conductor 9 inside the chamber near the flange is covered with a high voltage ceramic insulator 10. An Aluminum support cross bar 8 that is ⅛" in diameter with a mounting hole in the center is press-fitted onto the conductor 9 end. This crossbar 8 in turn supports the cylindrical apertured electrode 6 by being fitted into a pair. of holes in the electrode. The electrode 6 is made of Aluminum screen that has ⅛" diameter holes punched into it in a regular pattern. The electrode 6 cylinder has a diameter of about 20 mm. The conductor 9 is concentric to the electrode cylinder 6.

On the sides of the device body 12 are mounted the gas inlet 3 manifold and a pirani gauge 24. The pirani gauge 24 is used to measure the vacuum inside the chamber 4 while the device is operating. The pressure range for making oxygen radicals without sputtering from air efficiently is from 0.2 Torr to about 1 Torr. At these pressures sputtering is surpressed by the very short mean free paths in the vacuum. The gas inlet 3 manifold has solenoid valve 2 for opening and closing the gas flow and a needle valve 1 for controlling the flow of gas into the chamber. The gas feed port 15 may be left either open to the air or connected to another gas source.

The device is mounted to the vacuum chamber or electron microscope by means of an adapter flange 14 that has ISO KF40 flanges 11 on the end. A vacuum seal is made between the ISI KF flanges 11 by means of an elastomer O-ring 16 that is held in place by a centering ring 18. The ISO KF 40 flanges 11 are held together by standard ISO KF clamps which are not shown for clarity.

The second preferred embodiment is shown in FIG. 2. In this version of the device the length of he plasma chamber 4 is extended by clamping two ISO KF 40 cylinders 12 together and making a longer cylindrical electrode 6. Each segment. of the body has a single threaded hole 13 for the gas inlet and Pirani gauge. The gas inlet 3 is placed closest to the RF feedthrough 22 and the Pirani gauge 24 is mounted on the other segment. This extended version is for systems where larger vacuum pumps allow for high pumping speeds and high gas flow through the plasma. By making the plasma region longer the gas molecules have a longer residence time in the plasma and more active species are produced.

The third embodiment of the device uses CF type flanges with copper gaskets instead ISO KF40 flanges with O-rings. CF 2¾: flanges are also suitable for cylinders with about 40 mm diameter bodies. CF flanges with copper gaskets allow the device to be mounted on ultra high vacuum systems.

In the fourth embodiment of the device ISO KF 50 flanges are used. The use of ISO KF 50 flanges allows the inside diameter of the chamber cylinder 4 to be increased to about 50 mm. inches. This in turn allows the diameter of the electrode 6 to be increased.

The cylindrical RF electrode 6 has been described in a previous patent application. In the preferred embodiments of the present invention it is made of punched Aluminum screen that has been bent into a cylindrical shape. The punched holes in the screen are about ⅛" diameter. Because it is cut from sheet screening there are many sharp edges that form high electric gradient fields to facilitate plasma ignition. The cylinder forms a hollow cathode surrounded by many small hollow cathodes. In addition, when RF is supplied to the electrode, RF eddy currents rotate around the apertures to provide inductive as well as capacitive coupling of the RF to the plasma.

I claim:

1. Apparatus for removing hydrocarbons from Electron Microscopes and other vacuum chambers by oxidation with RF plasma generated oxygen radicals comprising:

a plasma chamber for generating oxygen radicals (oxygen atoms) from a variety of oxygen containing gases including air with said radicals carried by convection into adjoining said vacuum chamber, said plasma chamber consisting of a non-ferrous, non-magnetic metal cylinder between 35 mm and 60 mm inside diameter and between 25 mm and 120 mm long, said plasma chamber mounted on said vacuum chamber with a vacuum tight seal means, a gas inlet means on the side of said plasma chamber that allows a metered leak of said oxygen containing gas into said plasma chamber to maintain a predetermined vacuum pressure and to feed said gas through said RF plasma, a vacuum gauge means mounted on the side of said plasma chamber that allows pressure to be monitored inside said apparatus, an electrode means of ignition of said plasma at below 20 Watts of RF power without magnetic confinement, an electrical feedthrough means in a circular flange mounted on the end of said cylindrical chamber with a vacuum tight seal means, a coaxial conductor means extending into said chamber from said feedthrough means, a conductive crossbar means connecting said conductor means with said electrode means to support and to feed RF power to said electrode, whereby said oxygen radicals are used to oxidize said hydrocarbons to form CO, H2O and CO2 gases that may removed from said vacuum chamber by vacuum pumping means.

2. An apparatus as described in claim 1 further including an electrode means that operates at 13.56 MHz in the form of a cylinder with a diameter between 12 mm and 30 mm containing a multitude of small apertures between 10 and 25 $mm^2$ size such that the plasma ignites at low RF power below 20 Watts, and said electrode does not extend outside said plasma chamber.

* * * * *